(12) United States Patent
Cunningham et al.

(10) Patent No.: US 10,157,093 B2
(45) Date of Patent: Dec. 18, 2018

(54) DATA INTEGRITY CHECK WITHIN A DATA PROCESSING SYSTEM

(71) Applicant: FREESCALE SEMICONDUCTOR, INC., Austin, TX (US)

(72) Inventors: Jeffrey C. Cunningham, Austin, TX (US); Ross S. Scouller, Austin, TX (US)

(73) Assignee: NXP USA, Inc., Austin, TX (US)

( * ) Notice: Subject to any disclaimer, the term of this patent is extended or adjusted under 35 U.S.C. 154(b) by 116 days.

(21) Appl. No.: 14/722,632

(22) Filed: May 27, 2015

(65) Prior Publication Data

US 2016/0350164 A1    Dec. 1, 2016

(51) Int. Cl.
| | | |
|---|---|---|
| *G06F 11/07* | (2006.01) | |
| *G11C 16/34* | (2006.01) | |
| *G11C 29/50* | (2006.01) | |
| *G11C 29/52* | (2006.01) | |
| *G06F 11/10* | (2006.01) | |
| *G11C 7/00* | (2006.01) | |
| *G11C 7/20* | (2006.01) | |
| *G11C 29/42* | (2006.01) | |

(Continued)

(52) U.S. Cl.
CPC .......... *G06F 11/079* (2013.01); *G06F 11/073* (2013.01); *G06F 11/0751* (2013.01); *G06F 11/1068* (2013.01); *G11C 7/00* (2013.01); *G11C 7/20* (2013.01); *G11C 16/3418* (2013.01); *G11C 16/3431* (2013.01); *G11C 16/3454* (2013.01); *G11C 29/42* (2013.01); *G11C 29/50004* (2013.01); *G11C 29/52* (2013.01); *G06F 3/0679* (2013.01); *G06F 12/0246* (2013.01); *G11C 11/5642* (2013.01); *G11C 2029/4402* (2013.01)

(58) Field of Classification Search
CPC ... G11C 11/5642; G11C 16/3418; G11C 7/00; G11C 7/20; G11C 16/3431; G11C 16/3454; G11C 29/42; G11C 29/50004; G11C 29/52; G06F 3/0679; G06F 11/073; G06F 11/079; G06F 11/1068; G06F 11/0751; G06F 12/0246
USPC ........................................ 714/6.11, 721, 764
See application file for complete search history.

(56) References Cited

U.S. PATENT DOCUMENTS 6,385,721 B1 * 5/2002 Puckette ............... G06F 9/4408
  713/2
6,778,442 B1    8/2004 Hamilton et al.
(Continued)

*Primary Examiner* — April Y Blair
*Assistant Examiner* — Sazzad Hossain

(57) ABSTRACT

A memory system includes a memory array, control circuitry, and comparator circuitry. The memory array includes a first section having a first plurality of programmed bitcells having a first threshold voltage distribution and a second section having a second plurality of programmed bitcells having a second threshold voltage distribution which has a lower average threshold voltage than the first threshold voltage distribution. The first plurality and second plurality of programmed bitcells are programmed with a same set of data values. The control circuitry is configured to provide a read request to the memory array and receive read data in response to the read request, wherein the read data comprises first read data from the first section and second read data from the second section. The comparator circuitry is configured to compare the first read data to the second read data and generate an error indicator in response to the compare.

20 Claims, 5 Drawing Sheets

(51) Int. Cl.
*G06F 3/06* (2006.01)
*G06F 12/02* (2006.01)
*G11C 11/56* (2006.01)
*G11C 29/44* (2006.01)

(56) References Cited

U.S. PATENT DOCUMENTS

| | | |
|---|---|---|
| 8,069,377 B2 | 11/2011 | Singh |
| 8,156,398 B2 | 4/2012 | Sommer |
| 8,402,326 B2 | 3/2013 | Singh |
| 8,504,884 B2 | 8/2013 | Eguchi et al. |
| 8,694,849 B1 | 4/2014 | Micheloni et al. |
| 8,782,478 B2 | 7/2014 | Eguchi et al. |
| 8,875,006 B2 | 10/2014 | Bueb |
| 9,081,062 B1* | 7/2015 | Pedersen .......... G01R 31/31816 |
| 9,432,298 B1* | 8/2016 | Smith ................. H04L 49/9057 |
| 2004/0236980 A1* | 11/2004 | Chen .................... G06F 9/4401 |
| | | 713/600 |
| 2005/0160217 A1* | 7/2005 | Gonzalez ............ G06F 11/1068 |
| | | 711/6 |
| 2008/0126893 A1* | 5/2008 | Harrand .................. G11C 7/04 |
| | | 714/719 |
| 2010/0142271 A1* | 6/2010 | Honma .................. G11C 16/26 |
| | | 365/185.03 |
| 2011/0216598 A1 | 9/2011 | Kim et al. |
| 2013/0268717 A1 | 10/2013 | Scouller et al. |
| 2014/0025866 A1* | 1/2014 | Kim .................... G06F 12/0246 |
| | | 711/103 |
| 2014/0089762 A1* | 3/2014 | Pangal ................ G06F 11/1008 |
| | | 714/773 |
| 2014/0281635 A1* | 9/2014 | Reddy .................. G06F 1/3234 |
| | | 713/323 |
| 2014/0281750 A1 | 9/2014 | Jeon et al. |
| 2014/0351628 A1* | 11/2014 | Higeta ................ G06F 11/2053 |
| | | 714/6.11 |
| 2015/0095738 A1* | 4/2015 | Zampaglione ........ H03M 13/13 |
| | | 714/758 |

\* cited by examiner

DATA INTEGRITY CHECK WITHIN A DATA PROCESSING SYSTEM

BACKGROUND

Field

This disclosure relates generally to data processing systems, and more specifically, to data integrity checking within a data processing system.

Related Art

In a data processing system, embedded firmware and data must be read from nonvolatile memory (NVM) in order to execute many of the commands necessary for operating the embedded nonvolatile memory. For example, these reads pass parameters used for setting up and controller the bias voltages necessary for many of the operations in the non-volatile memory, such as trim levels, pulse durations, verify levels, etc. Any reads to this firmware and data which outputs incorrect values has the potential for destructive system failure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In a data processing system, nonvolatile memory (NVM), such as a flash memory, is commonly used to store production programmed execute control code and reference data. The execute control code and reference data is programmed at the time of production by the manufacturer, before shipping the product to customers, and may include, for example, firmware and parameters which are necessary for operating the NVM. When the data processing system is initially powered up or reset, it is important that the read data output from read operations of the execute control code and reference data be correct. Otherwise, the data processing system has the potential for destructive failure. However, when initially powered up or reset, the NVM begins in a dirty state in which the operation parameters are still "loose". For example, reference voltages are not yet accurate because the trims are not yet set. As a result, read operations in this initial dirty state are error prone. Therefore, in one embodiment, the execute control code and reference data is divided into two parts in the NVM which are programmed with the same data but using different programming levels. One part, referred to as the production data, is programmed at a production level while the other one of the two parts, referred to as the margin data, is programmed at a reduced margin level. Comparisons between the production data and the margin data can be used to detect compromised data in the execute control code and reference data of the NVM before failure of the production data. Furthermore, an additional status bit within the NVM may be used to track when comparison failures are detected.

Figure 1:
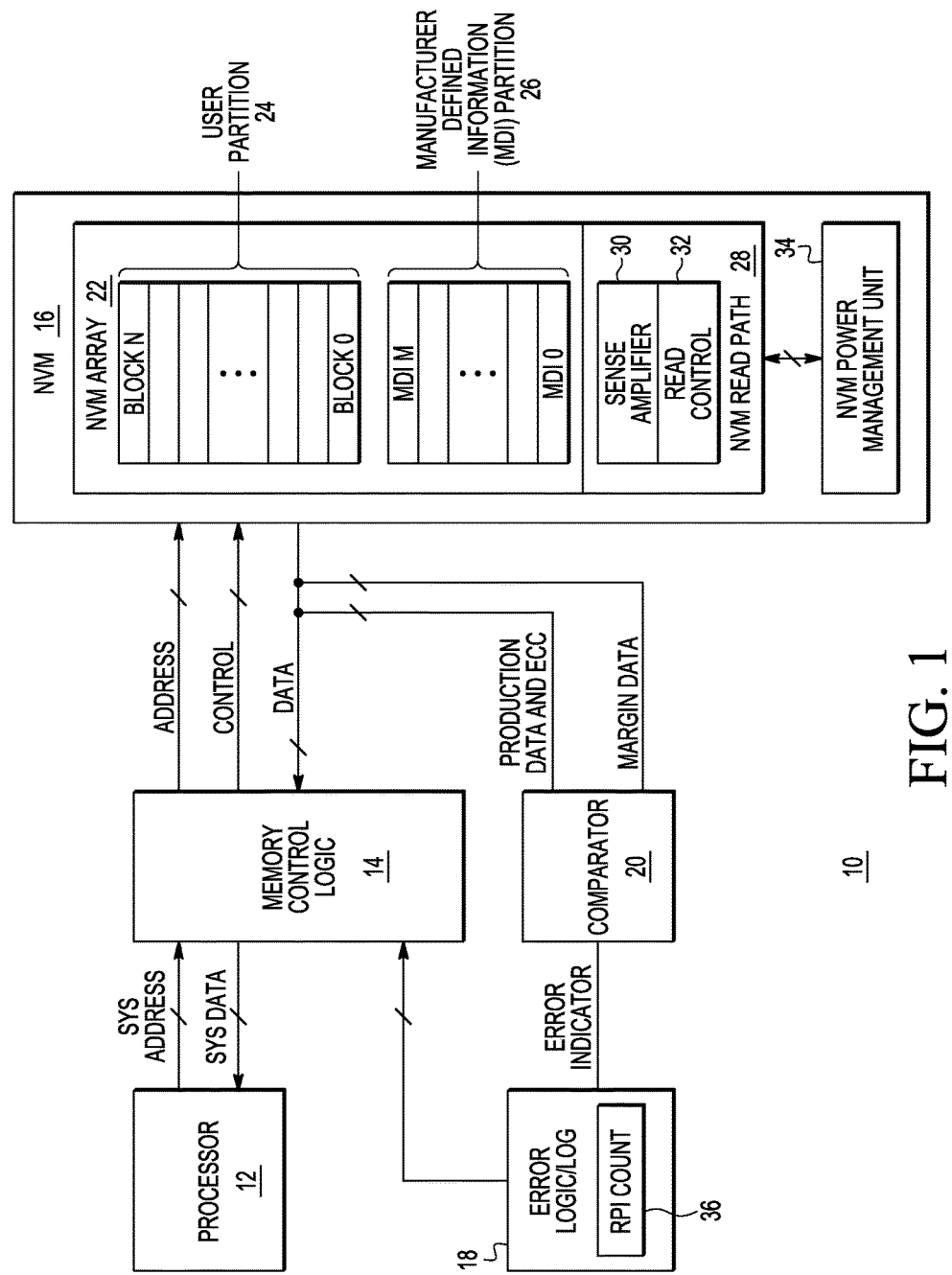
FIG. 1 illustrates, in block diagram form, a data processing system having a nonvolatile memory (NVM) in accordance with one embodiment of the present invention.

FIG. 1 illustrates, in block diagram form, a data processing system 10 having a processor 12, memory control logic 14, an NVM 16, a comparator 20, and warning logic and log 18. Processor 12 provides system addresses to memory control logic 14 and communicates system data with memory control logic 14 for performing read and write operations on NVM 16. Memory control logic 14 provides address and control signals to NVM 16 and receives read data by way of data signals from NVM 16. Note that for write operations, memory control logic 14 provides write data to NVM 16 by way of the data signals. NVM 16 includes an NVM array 22 which includes a user partition 24 and a manufacturer defined information (MDI) partition 26. User partition 24 includes N+1 blocks of data, block 0-block N. MDI partition 26 includes M+1 blocks of data, MDI 0-MDI M. NVM 16 also includes NVM read path circuitry 28 which includes sense amplifiers 30 and read control circuitry 32. NVM 16 includes an NVM power management unit 34 coupled to NVM array 22. Comparator 20 is coupled to the data signals from NVM 16 and receives production data and error correction code (ECC) data at a first input and receives margin data at a second input. Comparator 20 provides an error indicator to warning logic and log 18. Warning logic and log 18 includes storage circuitry configured to store a refresh program indicator (RPI) count 36, and is coupled to memory control logic 14.

Figure 2:
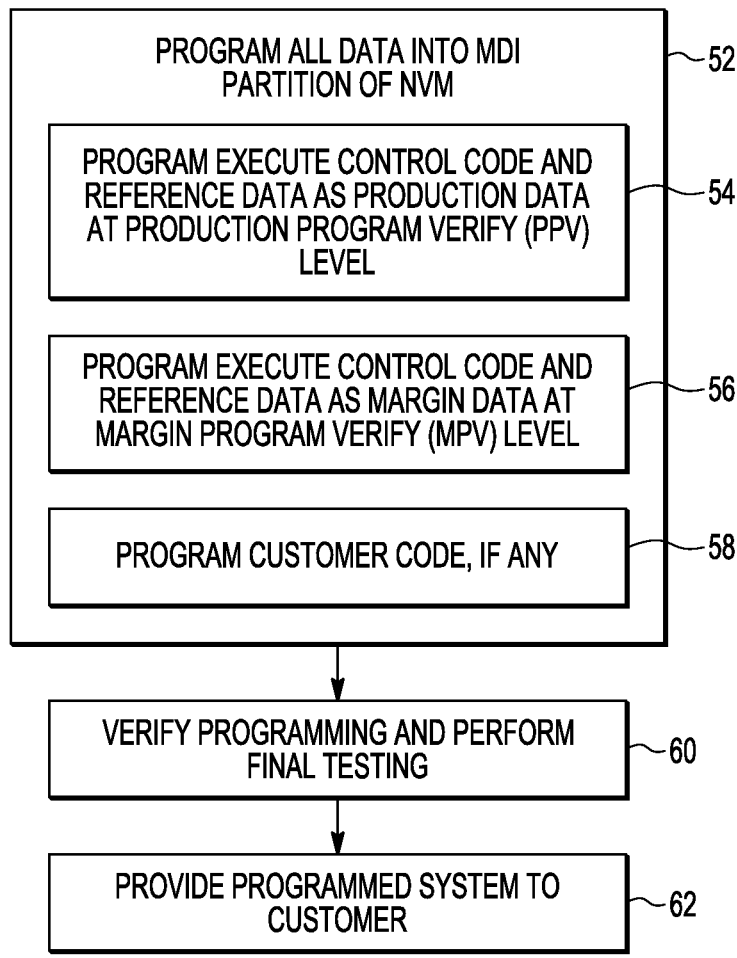
FIG. 2 illustrates, in flow diagram form, a method of programming information into the NVM of FIG. 1, in accordance with one embodiment of the present invention.

Operation of data processing system 10 will be described in more detail in references to FIGS. 2-6. FIG. 2 illustrates, in flow diagram form, a method 50 for programming NVM 16 at the time of production by a manufacturer, prior to providing the data processing system to the customer, in accordance with one embodiment of the present invention. Method 50 begins with block 52 in which all data is programmed into MDI partition 26 of NVM array 22. In block 54, execute control code and reference data is programmed into MDI partition 26 as production data. The production data is programmed at a production program verify (PPV) level. If a bitcell storing production data has a threshold voltage above the PPV level, then it is considered to be programmed. Still within block 52, in block 56, execute control code and reference data is programmed into MDI partition 26 as margin data. The margin data is the same data as the production data but is programmed at a margin program verify (MPV) level. If a bitcell storing production data has a threshold voltage above the MPV level, then it is considered to be programmed. Also, in block 58 within block 52, customer code (i.e. code provided by the customer), if any, can be programmed by the manufacturer into MDI partition 26. Method 50 continues to block 60 in which programming of MDI partition 26 is verified and any final testing is performed. Method 50 then proceeds to block 62 in which the programmed data processing system is provided or shipped to the customer.

The execute control code and reference data programmed in blocks 54 and 56 of FIG. 2 may include firmware (e.g. instructions or commands) and parameters which are necessary for operating NVM 16. The execute control code uses the reference data to set up NVM 16. For example, the execute control code uses the reference data to set up reference voltage levels and trim values for the voltage levels. These may be used, for example, by sense amplifiers 30 and read control 32 of NVM read path circuitry 28 and by NVM power management unit 34. The execute control code may also use the reference data to establish values in other analog blocks of NVM 16 and can send trims to these analog blocks.

Figure 4:
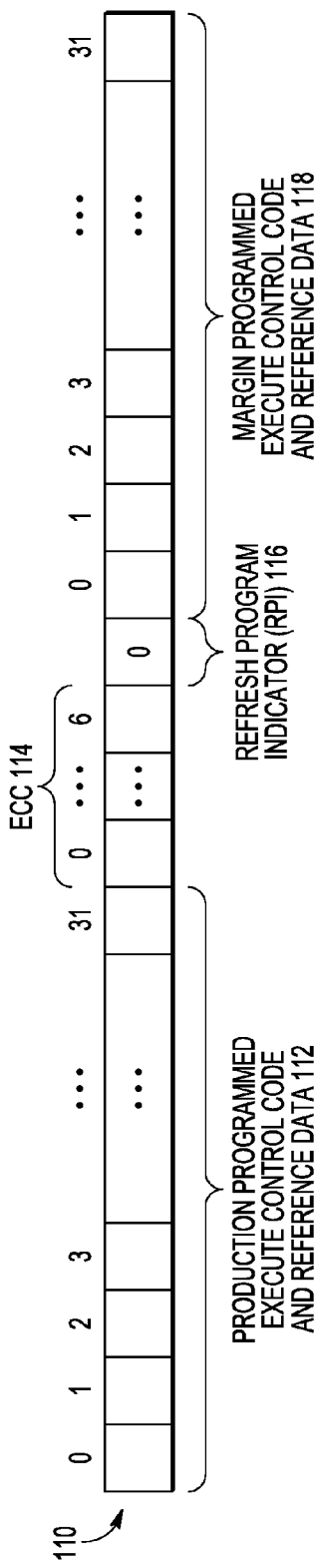
FIG. 4 illustrates, in diagrammatic form, an entry in the NVM of FIG. 1, in accordance with one embodiment of the present invention.

In one embodiment, the production data and the margin data are programmed into a same entry or line of memory in MDI partition 26 of NVM array 22. FIG. 4 illustrates an example of an entry 110 in MDI partition 26 which includes 32 bits (bit0-bit31) of production programmed execute control code and reference data 112, 7 bits (bit0-bit6) of error correction code (ECC) 114, a refresh program indicator (RPI) field 116, and 32 bits (bit0-bit31) of margin programmed execute control code and reference data 118. Note that production programmed execute control code and reference data 112, which is programmed at the PPV level, is referred to as the production data, and margin programmed execute control code and reference data 118, which is programmed at the MPV level, is referred to as the margin data. ECC 114 corresponds to the error correction code generated from production programmed execute control code and reference data 112 and is also programmed at the PPV level. RPU 116 is illustrated as a single bit field, but may be implemented using more than one bits. Similarly, a different number of bits may be used to store the production data, ECC, RPI, and margin data, depending on the design of NVM 16.

Still referring to FIG. 4, note that the same data is used to program both production programmed execute control code and reference data 112 and margin programmed execute control code and reference data 118. However, different program verify levels are used to program the production data and the margin data. The production data and the ECC are programmed at the PPV level and the margin data is programmed at the MPV level, in which the MPV level is lower than the PPV level.

Figure 3:
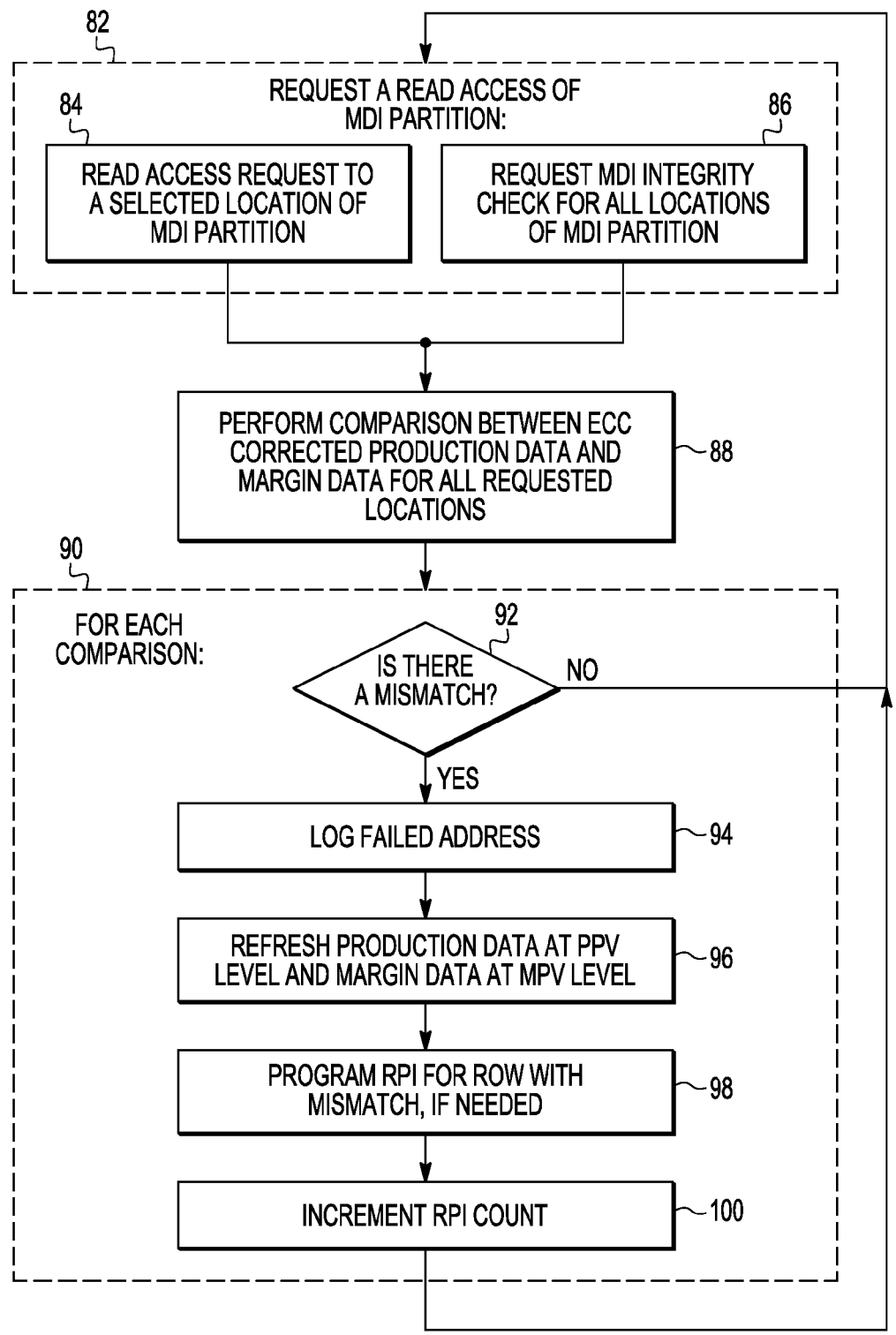
FIG. 3 illustrates, in flow diagram form, a method of accessing information from the NVM of FIG. 1 in accordance with one embodiment of the present invention.
Figure 5:
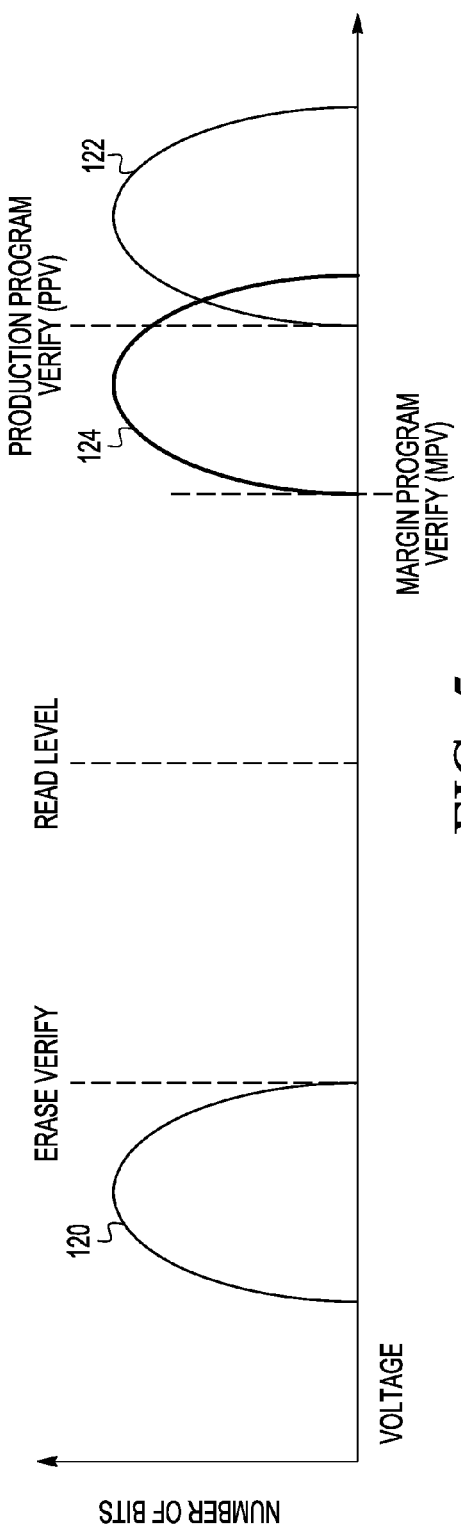
FIG. 5 illustrates, in graphical form, a distribution of erased and programmed bits of the NVM of FIG. 1 in accordance with one embodiment of the present invention.

FIG. 5 illustrates, in graphical form, a distribution of erased and programmed bits of MDI partition 26 after performing the programming of blocks 54 and 56 of FIG. 3, in accordance with one embodiment of the present invention. MDI partition 26 includes a distribution 120 of bitcells which includes a first number of erased bitcells. Any erased bitcell has a threshold voltage at or below an erase verify level. Note that known techniques may be used to erase blocks of memory within NVM 16. In accordance with one known technique, NVM 16 can only be erased at a block level. After the programming of blocks 54 and 56 of FIG. 3, MDI partition 26 includes a distribution 122 of bitcells which includes a second number of bitcells which have been programmed in accordance with the PPV level, and a distribution 124 of bitcells which includes a third number of bitcells which have been programmed in accordance with the MPV level. Distribution 122 corresponds to bitcells which store the production data and distribution 124 corresponds to bitcells which store the margin data. In one embodiment, a bitcell is programmed by the application of a series of programming pulses until the threshold voltage of the bitcell reaches the desired program verify level. The bitcells of distribution 122, corresponding to the bitcells programmed with the production data, are programmed to a higher program verify level (PPV) as compared to the bitcells of distribution 124, corresponding to the bitcells programmed with the margin data. Therefore, the bitcells of distribution 124 have a reduced program verify level (the MPV level) as compared to the PPV level. The bitcells of distribution 122 are centered about a first mean threshold voltage value and the bitcells of distribution 124 are centered about a second mean threshold voltage value that is less than the first mean threshold voltage value. That is, the average threshold voltage of the bitcells programmed with the production data using PPV is greater than the average threshold voltage of the bitcells programmed with the margin data using MPV.

Figure 7:
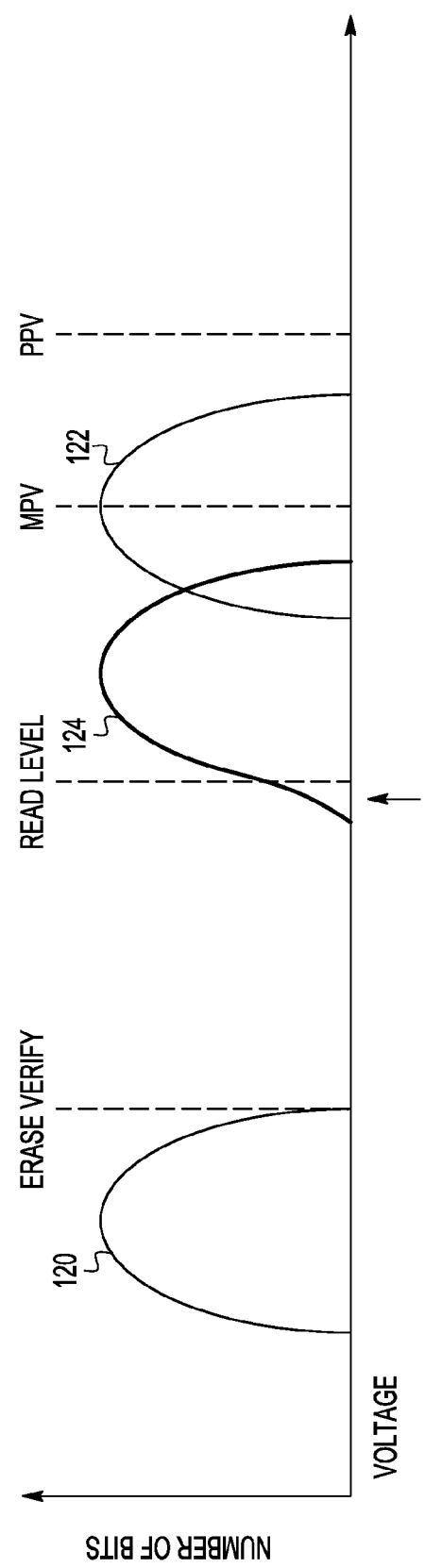
FIG. 7 illustrates, in graphical form, a distribution of erased and programmed bits having a data retention failure.

When bitcells of NVM 16 are read by NVM read path circuitry 28, a same read level voltage is used by sense amplifiers 30 to determine whether a particular sensed bitcell is programmed or erased. If the sensed bitcell has a threshold voltage greater than the read level, then the sensed bitcell is read as a programmed bit. If the sensed bitcell has a threshold voltage less than the read level, then the sensed bitcell is read as an erased bit. In one embodiment, a programmed bit corresponds to a logic level one and an erased bit corresponds to a logic level zero. In an alternate embodiment, a programmed bit corresponds to a logic level zero and an erased bit to a logic level one. Over time, due to program disturb and data retention, the distribution curves of distributions 124 and 122 shift left, in which the threshold voltages of the bitcells decrease, causing them to move closer to the read level. If the threshold voltage of a programmed bit shifts too far to the left, the bitcell may be misread as an erased bit rather than a programmed bit. Since both distributions 124 and 122 are within MDI partition 26 of NVM array 22, both distributions shift left, over time, by the same or similar amounts. Therefore, note that the margin data of distribution 124 will provide false reads prior to the production data of distribution 122 since the program verify level of the margin data is initially less than the program verify level of the production data. FIG. 7 illustrates the shifts in distributions 124 and 122 over time in which a bit in distribution 124 results in a data retention failure since it shifted over the read level. In this case, that bit will be read as an erased bit rather than a programmed bit. FIG. 7 will be addressed in further detail below.

Since both distributions 124 and 122 shift at a same rate over time, when a failure occurs with the margin data of distribution 124, a refresh operation of NVM array 16 can be flagged in order to correct the distribution shifts and raise the threshold voltages of the programmed bits. Since the same data is programmed as both the production data and the margin data, the data, in a bit-wise compare between the ECC corrected production data and margin data, should match. When they do not match, it is likely that the margin data is no longer at a passing level for a correct read and therefore, the production data is likely soon to fail. At this point, a warning of the failure can be provided and logged, and a refresh operation can be performed on the location. Also, the RPI bit of the memory entry which resulted in the mismatch can be programmed to signify that a refresh has occurred. Furthermore, a count of the programmed RPI bits may be maintained. Therefore, in one embodiment, each time data is read from an entry of MDI partition 26, a comparison is performed between the ECC corrected production data and the margin data.

FIG. 3 illustrates, in flow diagram form, a method 80 for reading data from MDI partition 26, in accordance with one embodiment of the present invention. Method 80 begins with block 82 in which a read access request is made to the MDI partition. The read access request can be generated by processor 12 in different ways. In block 84, a read access request is made to a selected location of the MDI partition. This is the case in which a particular memory location with the MDI partition needs to be read by processor 12. Alternatively, in block 84, a request can be made for an MDI integrity check for all locations of the MDI partition. In this case, read requests can be iteratively generated, such as by memory control logic 14, for each address location in the MDI partition. In either case of block 84 or 86, a read access is made to one or more requested locations of the MDI partition. Method 80 proceeds to block 88 in which a bit-wise comparison is performed between the ECC corrected production data and the margin data for all requested locations. If there was a read request to a selected location, such as in block 84, only one entry in the MDI partition is checked in block 88. If there was an integrity check request, then each entry in the MDI partition is iteratively checked in block 88. For each entry checked, the ECC bits are first used to correct the production data and then the corrected production data is compared with the margin data. For example, referring to entry 110 of FIG. 4, ECC bits 114 are used to correct production data 112, and after correction, the corrected production data 112 is bit-wise compared with margin data 118. This may be performed, for example, by comparator 20 of FIG. 1 which receives production data, ECC bits, and margin data from NVM 16.

Figure 6:
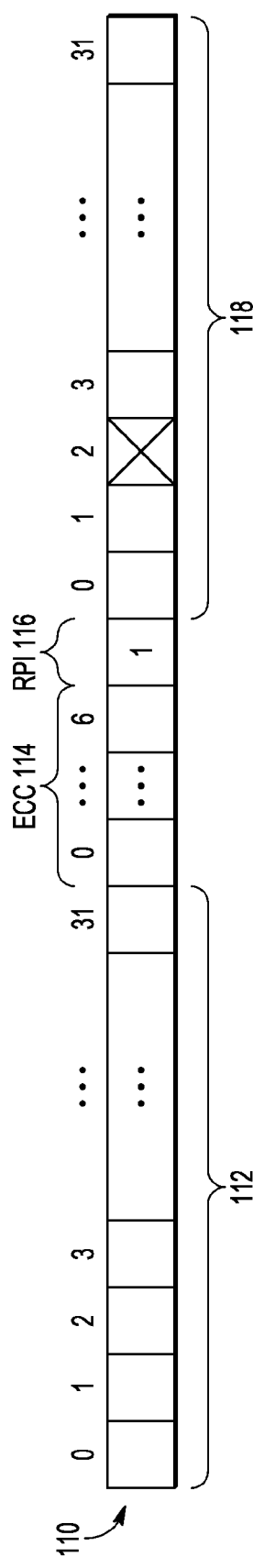
FIG. 6 illustrates, in diagrammatic form, the entry of FIG. 4 at a subsequent instant in time, in accordance with one embodiment of the present invention.

Method 80 proceeds to block 90 which occurs for each comparison made in block 88 for the requested read locations. For each comparison, at decision diamond 90, it is determined if a mismatch has occurred in the read entry. For example, FIG. 6 illustrates a result of a bit-wise comparison of entry 110 in which it is determined that bit2 of ECC corrected production data 112 did not match bit2 of margin data 118. If there is a mismatch, method 80 proceeds to block 94 in which the failed address is logged. For example, comparator 20 can communicate the mismatch along with the address of the entry which included the mismatch (such as the address of entry 110 in the example of FIG. 6) to warning logic and log 18 for storage. In this manner, entries with mismatches can be tracked. Method 80 then proceeds to block 96 in which a refresh is performed in NVM 16 by memory control logic 14. For the refresh, the production data is refreshed (i.e. programmed) at the PPV level and the margin data is refreshed (i.e. programmed) at the MPV level. After the refresh, the method proceeds to block 98 in which the RPI field for the entry location with the mismatch is programmed, if needed. As seen in the example of FIG. 6, since there was a mismatch of bit2, the RPI bit is programmed (e.g. set to a logic level one). The RPI bit therefore indicates that a refresh of that entry has occurred. In one embodiment, once a refresh has occurred of the entry has occurred and its RPI bit has been set, it remains set. In this case, if a mismatch again occurs in the same entry, the RPI bit need not be programmed again. In an alternate embodiment, additional bits may be used for the RPI field which counts the number of times a refresh has occurred for the entry. Method 80 then proceeds to block 100 in which the RPI count is incremented. For example, RPI count 36 within warning logic and log 18 can keep track of the number of entries which have needed a refresh due to mismatch with the margin data. After block 100, or there is no mismatch at decision diamond 92, method 80 returns to block 82 until another read access request is made to the MDI partition.

Note that the refresh of block 96 may be performed at a later time and need not be performed immediately after a mismatch is detected. In one embodiment, refreshes of those entries with mismatches logged by warning logic and logged 18 may be performed periodically. In one embodiment, the refresh may be performed based on RPI count 36. Therefore, note that each time a mismatch is logged, a need for a refresh operation is indicated. The refresh itself may be performed at a later time. However, note that since the mismatches occur due to the shift in the distribution of the margin data, once the margin data fails, there is time available to perform a refresh before the production data fails. In this manner, refreshes can be performed prior to the production data shifting too far left, preventing device failure. Furthermore, refreshes can be flagged after each read access of a particular location in the MDI partition which results in a mismatch or refreshes can be flagged in response to a full integrity check of the MDI partition in which every location in the MDI partition is checked at a particular time for a mismatch.

Therefore, by now it can be appreciated how an impending failure may be prevented by programming execute control code and reference data in two sections of an NVM using different programming verify levels. In one section the execute control code and reference data is programmed at a first level and in the other section, the same execute control code and reference data is programmed at a second, reduced, level. Upon read accesses of the execute control code and reference data, whether in response to reads of particular locations of the NVM or to a full integrity check of a group of locations of the NVM, mismatches between the two sections of execute control code and reference data can be logged and used to flag refresh operations of the NVM. Mismatches between the two sections of execute control code and reference data may indicate that the section programmed at the second reduced level has failed by falling below the valid read verify level. Therefore, a refresh of the execute control code and reference data can be performed prior to the section programmed at the first level failing the valid read verify level. In this manner, failure of the data processing system due to errors in reading the execute control code and reference data programmed at the first level is prevented. Furthermore, failure is prevented without having to modify the read verify level between reads to the two sections of execute control code and reference data.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, additional bits may be use to represent the RPI field in each entry, or the RPI field may be stored elsewhere within the NVM. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory system includes a memory array, wherein the memory array comprises a first section having a first plurality of programmed bitcells having a first threshold voltage distribution and a second section having a second plurality of programmed bitcells having a second threshold voltage distribution which has a lower average threshold voltage than the first threshold voltage distribution, wherein the first plurality and second plurality of programmed bitcells are programmed with a same set of data values; control circuitry configured to provide a read request to the memory array and receive read data in response to the read request, wherein the read data comprises first read data from the first section and second read data from the second section; and comparator circuitry configured to compare the first read data to the second read data and generate an error indicator in response to the compare. In one aspect of the embodiment, the same set of data values include execute control code and reference data. In a further aspect, the control circuitry is configured to use the execute control code and reference data to configure the memory array upon a reset of the memory system. In another aspect of the embodiment, the comparator circuitry performs a bit-wise compare of each bit in the first read data to a corresponding bit of the second read data. In a further aspect, the comparator circuitry is configured to assert the error indicator in response to a mismatch occurring in the bit-wise compare. In yet a further aspect, the memory system further includes an error log configured to store an address of the first read data when the error indicator is asserted. In another further aspect, the memory controller is configured to perform a refresh of the first and second section of the memory array if a mismatch occurs in the bit-wise compare. In a yet even further aspect, the first section further includes a refresh indicator corresponding to the first read data, wherein the memory controller is configured to assert the refresh indicator in response to performing the refresh. In another aspect of the embodiment, the first section further includes error correction code bits corresponding to the first read data, wherein the comparator circuitry is configured to correct the read data with the error correction code bits prior to comparing the first read data to the second read data. In another aspect, the memory array includes a user partition and a manufacturer defined information partition wherein the manufacturer defined information partition comprises the first section and the second section. In another aspect, the first read data is characterized as production data and the second read data is characterized as margin data.

In another embodiment, a method for generating an error indicator in a memory system includes performing a read access to a memory array to obtain first read data and second read data from the memory array, wherein the first read data and the second read data corresponds to a same set of programmed data values programmed with different program verify levels; performing a bit-wise comparison of the first read data with the second read data; and in response to a mismatch occurring in the bit-wise comparison, refreshing the memory array. In one aspect of the another embodiment, performing the read access to the memory array to obtain the first read data and the second read data is performed using a same read verify level for the first read data and the second read data. In another aspect, the same set of programmed data values comprises execute control code and reference data. In another aspect, performing the read access further obtains error correction code bits corresponding to the first read data, wherein the method further includes using the error correction code bits to correct the first read data prior to performing the bit-wise comparison. In another aspect, the method further includes, in response to refreshing the memory array, asserting a refresh indicator corresponding to the first and second read data. In a further aspect, the method further includes performing an integrity check of the memory array, wherein performing the read access and performing the bit-wise comparison is repeated for each location within a predetermined partition of the memory array.

In yet another embodiment, a memory system includes a nonvolatile memory array, wherein the memory array includes a first section having a first plurality of programmed bitcells having a first threshold voltage distribution and a second section having a second plurality of programmed bitcells having a second threshold voltage distribution which has a lower average threshold voltage than the first threshold voltage distribution, wherein the first plurality and second plurality of programmed bitcells are programmed with a same set of execute control code and reference data; control circuitry configured to provide a read request to the memory array and receive read data in response to the read request, wherein the read data comprises first read data from the first section and second read data from the second section, wherein the control circuitry is configured to use the execute control code and reference data to configure the memory array upon a reset of the memory system; and comparator circuitry coupled to compare each bit of the first read data to a corresponding bit of the second read data, wherein the control circuitry is configured to perform a refresh of the first read data and the second read data when a mismatch. In one aspect of the yet another embodiment, the first section further includes a refresh indicator corresponding to the first read data, wherein the memory controller is configured to assert the refresh indicator in response to performing the refresh. In another aspect, the first section further includes error correction code bits corresponding to the first read data, wherein the comparator circuitry is configured to correct the read data with the error correction code bits prior to comparing the first read data to the second read data.

What is claimed is:

1. A memory system, comprising:
a memory array, wherein the memory array comprises a first section having a first plurality of programmed bitcells having a first threshold voltage distribution and a second section having a second plurality of programmed bitcells having a second threshold voltage distribution which has a lower average threshold voltage than the first threshold voltage distribution, wherein the first plurality of programmed bitcells are programmed with a first N-bit data value using a first program verify level and second plurality of programmed bitcells are programmed with a second N-bit data value using a second program verify level different from the first program verify level, wherein the first N-bit data value and the second N-bit data value have identical bit values at corresponding bit positions;
control circuitry configured to provide a read request to the memory array and receive read data in response to the read request, wherein the read data comprises first read data from the first plurality of programmed bitcells and second read data from the second plurality of bitcells; and
comparator circuitry configured to compare the first read data to the second read data and generate an error indicator in response to the compare, wherein the error indicator indicates an impending failure of the memory system.

2. The memory system of claim 1, wherein each of the first N-bit data value and the second N-bit data value include execute control code and reference data.

3. The memory system of claim 2, wherein the control circuitry is configured to use the execute control code and reference data to configure the memory array upon a reset of the memory system.

4. The memory system of claim 1, wherein the comparator circuitry performs a bit-wise compare of each bit in the first read data to a corresponding bit of the second read data.

5. The memory system of claim 4, wherein the comparator circuitry is configured to assert the error indicator in response to a mismatch occurring in the bit-wise compare.

6. The memory system of claim 5, further comprising an error log configured to store an address of the first read data when the error indicator is asserted.

7. The memory system of claim 4, wherein the memory controller is configured to perform a refresh of the first and second plurality of programmed bitcells of the memory array if a mismatch occurs in the bit-wise compare.

8. The memory system of claim 7, wherein the first section further includes a refresh indicator corresponding to the first read data, wherein the memory controller is configured to assert the refresh indicator in response to performing the refresh.

9. The memory system of claim 1, wherein the first section further comprises error correction code bits corresponding to the first read data, wherein the comparator circuitry is configured to correct the read data with the error correction code bits prior to comparing the first read data to the second read data.

10. The memory system of claim 1, wherein the memory array comprises a user partition and a manufacturer defined information partition wherein the manufacturer defined information partition comprises the first section and the second section.

11. The memory system of claim 1, wherein the first read data is characterized as production data and the second read data is characterized as margin data.

12. A method for generating an error indicator in a memory system, comprising:
performing a read access to a memory array to obtain first read data and second read data from the memory array, wherein the first read data corresponds to a first N-bit value programmed with a first program verify level and the second read data corresponds to a second N-bit value programmed with a second program verify level different from the first program verify level, wherein the first N-bit data value and the second N-bit data value have identical bit values at corresponding bit positions;
performing a bit-wise comparison of the first read data with the second read data; and
in response to a mismatch occurring in the bit-wise comparison, refreshing the memory array, wherein the mismatch occurring indicates an impending failure of the memory system.

13. The method of claim 12, wherein performing the read access to the memory array to obtain the first read data and the second read data is performed using a same read verify level for the first read data and the second read data.

14. The method of claim 12, wherein the same set of programmed data values comprises execute control code and reference data.

15. The method of claim 12, wherein performing the read access further obtains error correction code bits corresponding to the first read data, wherein the method further comprises:
using the error correction code bits to correct the first read data prior to performing the bit-wise comparison.

16. The method of claim 12, further comprising:
in response to refreshing the memory array, asserting a refresh indicator corresponding to the first and second read data.

17. The method of claim 16, further comprising:
performing an integrity check of the memory array, wherein performing the read access and performing the bit-wise comparison is repeated for each location within a predetermined partition of the memory array.

18. A memory system, comprising:
a nonvolatile memory array, wherein the memory array comprises a first section having a first plurality of programmed bitcells having a first threshold voltage distribution and a second section having a second plurality of programmed bitcells having a second threshold voltage distribution which has a lower average threshold voltage than the first threshold voltage distribution, wherein the first plurality of programmed bitcells is programmed with a first N-bit value of execute control code and reference data using a first program verify level, wherein the second plurality of programmed bitcells is programmed with a second N-bit value of execute control code and reference data using a second program verify level different from the first program verify level, and wherein the first N-bit data value and the second N-bit data value have identical bit values at corresponding bit positions;
control circuitry configured to provide a read request to the memory array and receive read data in response to the read request, wherein the read data comprises first read data from the first section and second read data from the second section, wherein the control circuitry is configured to use the execute control code and reference data to configure the memory array upon a reset of the memory system; and
comparator circuitry coupled to compare each bit of the first read data to a corresponding bit of the second read data, wherein the control circuitry is configured to perform a refresh of the first read data and the second read data when a mismatch occurs, wherein the mismatch occurring indicates an impending failure of the memory system.

19. The memory system of claim 18, wherein the first section further includes a refresh indicator corresponding to the first read data, wherein the memory controller is configured to assert the refresh indicator in response to performing the refresh.

20. The memory system of claim 18, wherein the first section further comprises error correction code bits corresponding to the first read data, wherein the comparator circuitry is configured to correct the read data with the error correction code bits prior to comparing the first read data to the second read data.

* * * * *